United States Patent
Ben Mohamed et al.

(10) Patent No.: US 9,887,124 B2
(45) Date of Patent: Feb. 6, 2018

(54) METHOD FOR PRODUCING A COMPOSITE STRUCTURE

(71) Applicant: Soitec, Crolles (FR)

(72) Inventors: Nadia Ben Mohamed, Echirolles (FR); Eric Maze, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/900,257

(22) PCT Filed: Jun. 17, 2014

(86) PCT No.: PCT/FR2014/051487
§ 371 (c)(1),
(2) Date: Dec. 21, 2015

(87) PCT Pub. No.: WO2014/207346
PCT Pub. Date: Dec. 31, 2014

(65) Prior Publication Data
US 2016/0372361 A1    Dec. 22, 2016

(30) Foreign Application Priority Data
Jun. 28, 2013    (FR) ..................................... 13 01528

(51) Int. Cl.
*H01L 21/30* (2006.01)
*H01L 21/46* (2006.01)
(Continued)

(52) U.S. Cl.
CPC .. *H01L 21/76254* (2013.01); *H01L 21/02236* (2013.01); *H01L 21/30604* (2013.01)

(58) Field of Classification Search
CPC ................................ H01L 21/76; H01L 21/02
(Continued)

(56) References Cited

U.S. PATENT DOCUMENTS

| 6,342,433 | B1 | 1/2002 | Ohmi et al. |
| 6,884,694 | B2 * | 4/2005 | Park .................. H01L 21/76254 257/E21.568 |

(Continued)

FOREIGN PATENT DOCUMENTS

| CN | 101118845 B | 2/2008 |
| CN | 102347219 A | 2/2012 |

(Continued)

OTHER PUBLICATIONS

International Search Report for International Application No. PCT/FR2014/051487 dated Oct. 20, 2014, 2 pages.

(Continued)

*Primary Examiner* — Sheikh Maruf
(74) *Attorney, Agent, or Firm* — TraskBritt

(57) ABSTRACT

A process for the manufacture of a composite structure includes the following stages: a) providing a donor substrate comprising a first surface and a support substrate; b) forming a zone of weakening in the donor substrate, the zone of weakening delimiting, with the first surface of the donor substrate, a working layer; c) assembling the support substrate and the donor substrate; d) fracturing the donor substrate along the zone of weakening; and e) thinning the working layer so as to form a thinned working layer. Stage b) is carried out so that the working layer exhibits a thickness profile appropriate for compensating for the non-uniformity in consumption of the working layer during stage e).

17 Claims, 5 Drawing Sheets

(51) Int. Cl.
  *H01L 21/42* (2006.01)
  *H01L 21/00* (2006.01)
  *H01L 21/762* (2006.01)
  *H01L 21/02* (2006.01)
  *H01L 21/306* (2006.01)

(58) Field of Classification Search
  USPC ............ 438/458, 57; 257/506, 77, E21.568, 257/E27.112, E21.211, E29.104
  See application file for complete search history.

(56) References Cited

U.S. PATENT DOCUMENTS

| | | | | |
|---|---|---|---|---|
| 2003/0077885 A1* | 4/2003 | Aspar | ............ | H01L 21/76254 438/517 |
| 2003/0181001 A1* | 9/2003 | Aga | ............ | H01L 21/76254 438/200 |
| 2004/0014299 A1* | 1/2004 | Moriceau | ............ | H01L 21/76256 438/459 |
| 2004/0029359 A1* | 2/2004 | Letertre | ............ | C30B 25/02 438/458 |
| 2004/0115905 A1* | 6/2004 | Barge | ............ | H01L 21/306 438/473 |
| 2004/0161948 A1* | 8/2004 | Maleville | ............ | H01L 21/324 438/795 |
| 2004/0222500 A1* | 11/2004 | Aspar | ............ | B81C 99/008 257/629 |
| 2004/0241958 A1* | 12/2004 | Guarini | ............ | H01L 21/6835 438/455 |
| 2005/0020031 A1* | 1/2005 | Letertre | ............ | H01L 21/76254 438/455 |
| 2005/0148163 A1* | 7/2005 | Nguyen | ............ | H01L 21/76254 438/514 |
| 2006/0068565 A1* | 3/2006 | Droes | ............ | H01L 21/76254 438/458 |
| 2006/0076559 A1* | 4/2006 | Faure | ............ | C30B 25/18 257/49 |
| 2006/0091400 A1* | 5/2006 | Faure | ............ | H01L 21/76254 257/76 |
| 2006/0154442 A1* | 7/2006 | de Souza | ............ | H01L 21/76251 438/455 |
| 2006/0177991 A1* | 8/2006 | Murakami | ............ | H01L 21/76254 438/455 |
| 2007/0054466 A1* | 3/2007 | Hebras | ............ | H01L 21/76254 438/455 |
| 2007/0190737 A1* | 8/2007 | Morimoto | ............ | H01L 21/76254 438/406 |
| 2008/0070340 A1* | 3/2008 | Borrelli | ............ | H01L 21/76254 438/57 |
| 2008/0171443 A1* | 7/2008 | Hebras | ............ | H01L 21/76254 438/703 |
| 2008/0261054 A1* | 10/2008 | Gadkaree | ............ | H01L 21/76254 428/426 |
| 2008/0311726 A1* | 12/2008 | Ohnuma | ............ | H01L 21/76259 438/455 |
| 2009/0035920 A1* | 2/2009 | Neyret | ............ | H01L 21/76254 438/458 |
| 2009/0289332 A1* | 11/2009 | Boussagol | ............ | C30B 25/18 257/618 |
| 2009/0298261 A1* | 12/2009 | Endo | ............ | H01L 21/187 438/458 |
| 2010/0025228 A1* | 2/2010 | Tauzin | ............ | H01L 21/76254 204/192.11 |
| 2010/0096733 A1* | 4/2010 | Guiot | ............ | H01L 21/76254 257/632 |
| 2010/0120224 A1* | 5/2010 | Shimomura | ............ | H01L 21/84 438/458 |
| 2010/0248444 A1 | 9/2010 | Yamazaki et al. | | |
| 2010/0291753 A1* | 11/2010 | Kakehata | ............ | H01L 21/76254 438/458 |
| 2012/0097868 A1* | 4/2012 | Dickerson | ............ | H01L 21/76254 250/492.3 |
| 2013/0089968 A1* | 4/2013 | Usenko | ............ | H01L 21/76254 438/458 |
| 2014/0097523 A1 | 4/2014 | Aga et al. | | |
| 2014/0329372 A1 | 11/2014 | Aga et al. | | |

FOREIGN PATENT DOCUMENTS

| | | |
|---|---|---|
| CN | 102386123 A | 3/2012 |
| EP | 1705704 A1 | 9/2006 |
| FR | 2797714 A1 | 2/2001 |
| JP | 2012248739 A | 12/2012 |
| JP | 2013125909 | 6/2013 |

OTHER PUBLICATIONS

Sano et al., Ultraprecision Finishing Technique by Numerically Controlled Sacrificial Oxidation, Journal of Crystal Growth, vol. 310, (2008), pp. 2173-2177.
Chinese First Office Action from Chinese Application No. 201480036456.1, dated Sep. 29, 2016, 12 pages.
International Written Opinion for the International Searching Authority for International Application No. PCT/FR2014/051487 dated Oct. 20, 2014, 6 pages.
Chinese Second Office Action from Chinese Application No. 201480036456.1, dated Jun. 13, 2017, 7 pages.
Japanese First Office Action for Japanese Application No. 2016-522698 dated Sep. 5, 2017, 6 pages.

\* cited by examiner

METHOD FOR PRODUCING A COMPOSITE STRUCTURE

CROSS-REFERENCE TO RELATED APPLICATIONS

This application is a national phase entry under 35 U.S.C. § 371 of International Patent Application PCT/FR2014/051487, filed Jun. 17, 2014, designating the United States of America and published as International Patent Publication WO 2014/207346 A1 on Dec. 31, 2014, which claims the benefit under Article 8 of the Patent Cooperation Treaty and under 35 U.S.C. § 119(e) to French Patent Application Serial No. 1301528, filed Jun. 28, 2013, the disclosure of each of which is hereby incorporated herein in its entirety by this reference.

TECHNICAL FIELD

This disclosure relates to a process for the manufacture of a composite structure.

BACKGROUND

A process for the manufacture of a composite structure, known from the state of the art and illustrated in FIG. 1, comprises the following stages:
a) Providing a donor substrate 1 comprising a first surface 2, and a support substrate 3;
b) Forming a zone of weakening 4 in the donor substrate 1, the zone of weakening 4 delimiting, with the first surface 2 of the donor substrate 1, a working layer 5;
c) Assembling the support substrate 3 and the donor substrate 1;
d) Fracturing the donor substrate along the zone of weakening, so as to transfer the working layer 5 onto the support substrate 3;
e) Thinning the working layer 5 so as to obtain a thinned working layer 6.

However, the main disadvantage related to this manufacturing process of the state of the art is that the thinned working layer 6 exhibits a nonuniformity in thickness. This is because the thinning stage e) generally comprises a stage of partial oxidation of the working layer 5, followed by a withdrawal of the oxidized part of the working layer 5.

The oxidation partially oxidizes the working layer 5 over a nonuniform thickness. Thus, this is reflected by a variation in thickness of the thinned working layer 6 after withdrawal of the oxidized part of the working layer 5. The variation of thickness of the thinned working layer 6 can exceed 10 Å on conclusion of all of the stages.

This is, in particular, damaging for the manufacture of structures of the silicon-on-insulator type, for which control of the variation of thickness of the silicon layer to +/−5 Å is required.

The control of the thickness of the thinned working layer 6 on conclusion of all of the stages of the manufacturing process thus remains very difficult.

An aim of the disclosure is thus to provide a process for the manufacture of structures that makes possible better control of the variation of thickness of the thinned working layer 6.

BRIEF SUMMARY

This disclosure is targeted at overcoming the above-mentioned disadvantages and relates to a process for the manufacture of a composite structure comprising the following stages:

a) Providing a donor substrate and a support substrate, the donor substrate comprising a first surface;
b) Forming a zone of weakening in the donor substrate, the zone of weakening delimiting, with the first surface of the donor substrate, a working layer;
c) Assembling the support substrate and the donor substrate;
d) Fracturing the donor substrate along the zone of weakening, so as to transfer the working layer onto the support substrate;
e) Thinning the working layer so as to form a thinned working layer, the thinning consuming a nonuniform thickness of the working layer;
the manufacturing process being noteworthy in that stage b) is carried out so that the working layer transferred onto the support substrate exhibits a thickness profile on conclusion of stage d), the thickness profile being appropriate for compensating, at least in part, for the nonuniformity in consumption of the working layer during stage e), the thinned working layer being substantially uniform in thickness on conclusion of all of the stages.

Thus, the nonuniformity of the thickness profile of the working layer on conclusion of stage d) makes it possible to compensate for the nonuniformity of the thinning stage. In fact, the nonuniformity of the thinned working layer on conclusion of stage e) is improved.

According to one embodiment, the thinning stage e) comprises a stage of oxidation of the working layer so as to form a layer of oxide, the thickness of the layer of oxide being nonuniform, followed by a stage of withdrawal of the layer of oxide.

According to one embodiment, stage b) is carried out by implantation of at least one of the two species H or He.

Thus, the implantation of at least one of the two species, hydrogen or helium, makes it possible to form a zone of weakening.

According to one embodiment, the total dose of the implanted species is nonuniform over the extent of the zone of weakening, the nonuniformity of the dose of the implanted species being appropriate for generating the thickness profile of the working layer on conclusion of the fracturing stage d).

Thus, the implantation conditions make it possible to define a zone of weakening and, in particular, to condition the thickness profile of the working layer on conclusion of stage d).

This is because it has been found, unexpectedly, that the implantation of a total dose of species that is nonuniform over the whole of the extent of the zone of weakening makes it possible to adjust the variations in thickness of the working layer on conclusion of stage d). An excess thickness of a part of the working layer after stage d) is observed when the part is included, on conclusion of stage b), in a region of the zone of weakening exhibiting a dose of implanted species in excess with respect to the remainder of the zone of weakening.

According to one embodiment, the dose of implanted hydrogen ions is uniform over the whole of the extent of the zone of weakening and the dose of implanted helium ions is nonuniform over the extent of the zone of weakening.

Thus, the thickness profile of the working layer on conclusion of stage d) is conditioned by the dose of implanted helium ions.

According to one embodiment, the layer of oxide formed during stage e) exhibits a greater thickness in its central part and a lower thickness on proceeding toward the annular periphery of the layer of oxide, and the dose of implanted species is greater in the central part of the zone of weakening and lower on proceeding toward the annular periphery of the zone of weakening.

Thus, the excess dose of implanted species in the central part of the zone of weakening makes it possible to obtain a rounded thickness profile of the working layer on conclusion of stage d). Consequently, the thickness profile of the thinned working layer is substantially constant over the whole of the extent of the thinned layer.

According to one embodiment, the layer of oxide formed during stage e) exhibits a lower thickness in its central part and a greater thickness on proceeding toward the annular periphery of the layer of oxide, and the dose of species implanted during stage b) is lower in the central part of the zone of weakening and greater on proceeding toward the annular periphery of the zone of weakening.

Thus, the excess dose of implanted species of the annular periphery of the zone of weakening makes it possible to obtain a bowl-shaped thickness profile of the working layer on conclusion of stage d). Consequently, the thickness profile of the thinned working layer is substantially constant over the whole of the extent of the thinned layer.

According to an embodiment, stage b) is carried out in two stages:
  First implantation of species: according to a first implantation energy, the dose of the first implantation of species being nonuniform over the extent of the zone of weakening.
  Second implantation of species: according to a second implantation energy lower than the first implantation energy, the dose of the second implantation of species being nonuniform over the extent of the zone of weakening.

The second implantation energy is greater than 90% of the first implantation energy and the dose of the first implantation of species and the dose of the second implantation of species are complementary over the whole of the extent of the zone of weakening, the nonuniformity of the dose of the first implantation of species and the nonuniformity of the dose of the second implantation of species being appropriate for generating the thickness profile of the working layer on conclusion of the fracturing stage d).

According to one embodiment, the species implanted during the first implantation and the second implantation comprise hydrogen ions.

According to an embodiment, a dielectric layer is formed on the first surface of the donor substrate before stage b).

According to one embodiment, the dielectric layer comprises at least one of the following materials: silicon oxide or silicon nitride.

According to one embodiment, the donor substrate comprises at least one of the following materials: silicon, germanium or silicon/germanium alloy.

BRIEF DESCRIPTION OF THE DRAWINGS

Other characteristics and advantages will become apparent in the description that will follow of the embodiments of a process for the manufacture of a composite structure according to the disclosure, which are given as nonlimiting examples, with reference to the appended drawings, in which.

DETAILED DESCRIPTION

For the different embodiments, the same references will be used for identical elements or elements performing the same role, for the sake of simplification of the description.

Figure 1:
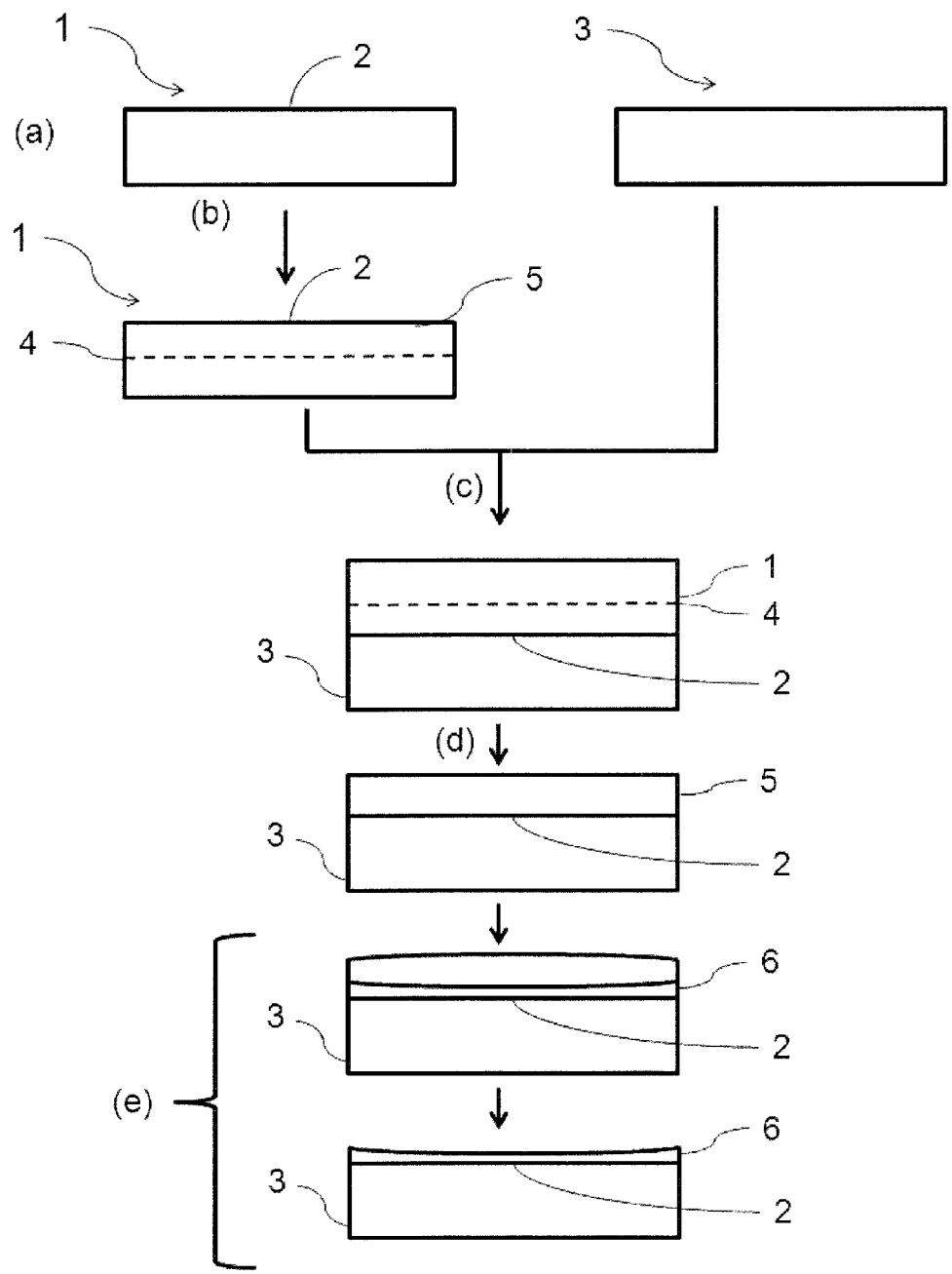
FIG. 1 is a diagrammatic representation of a process for the manufacture of a composite structure according to the known techniques of the prior art.
Figure 2:
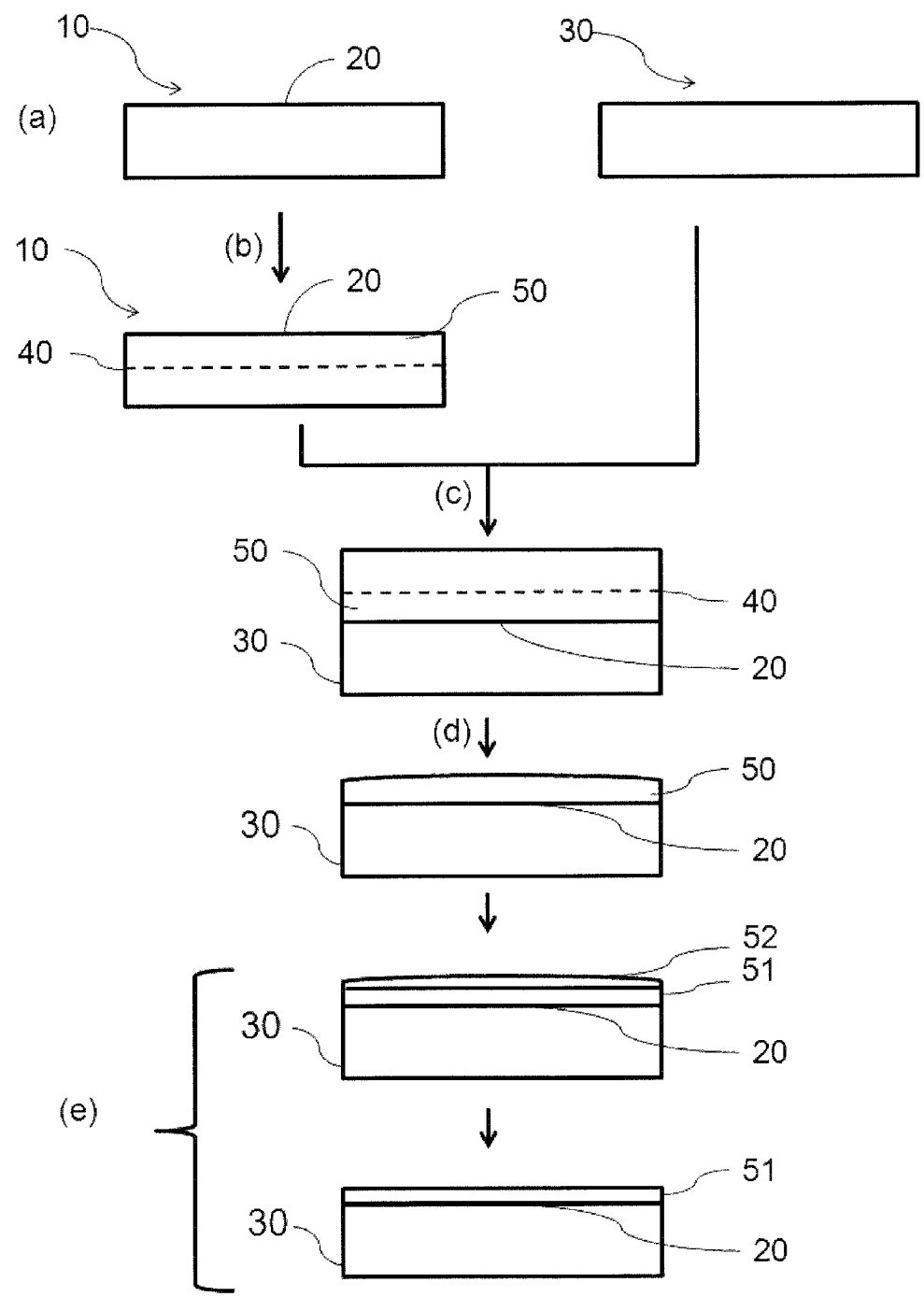
FIGS. 2 and 3 are diagrammatic representations of a process for the manufacture of a composite structure according to the disclosure.
Figure 3:
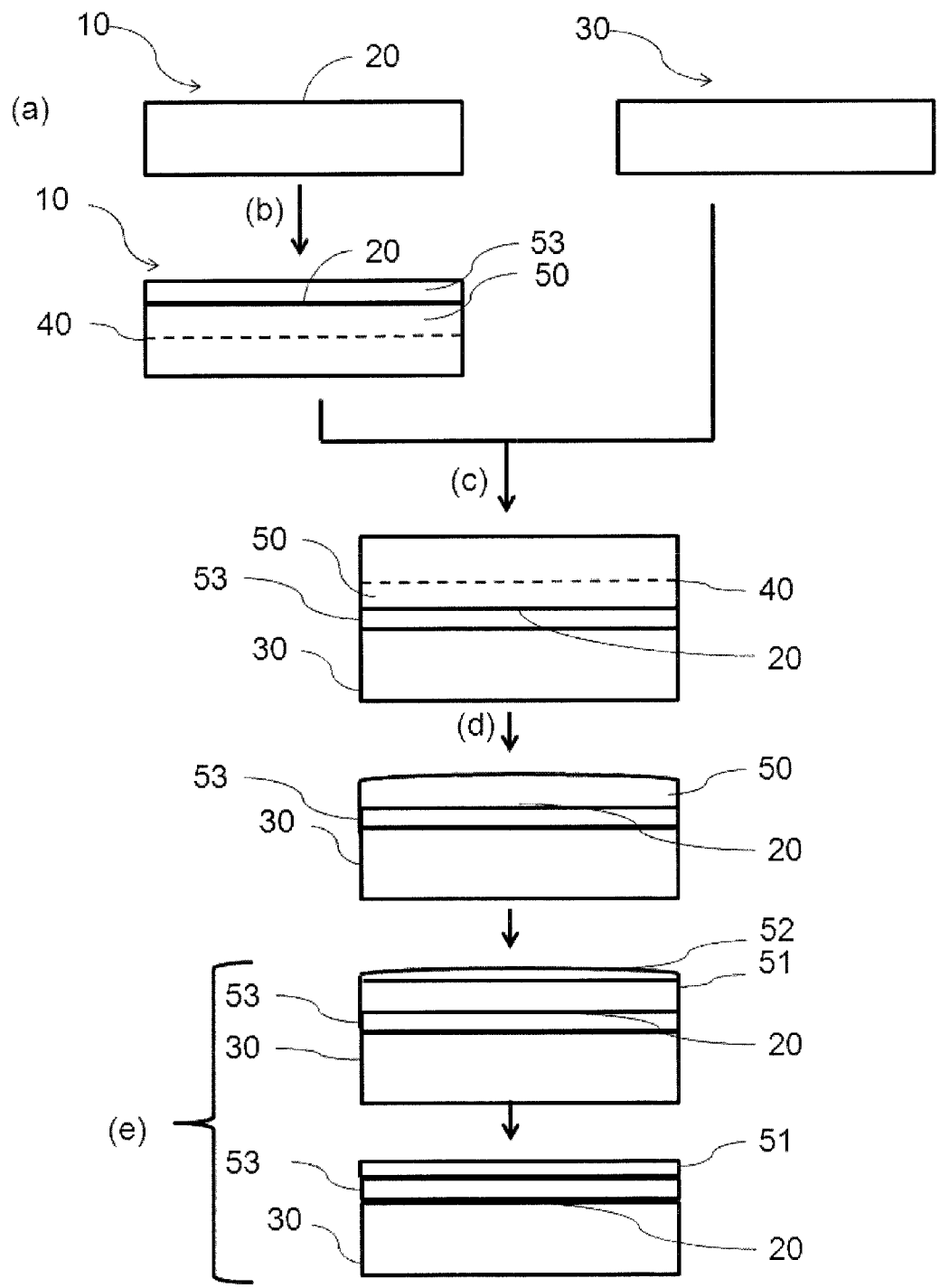

FIGS. 2 and 3 diagrammatically illustrate a process for the manufacture of a composite structure.

In order to render the illustration easier, the respective thicknesses of the different layers have not been represented to scale.

Stage a) of the process for the manufacture of the composite structure comprises the provision of a donor substrate 10 comprising a first surface 20, and a support substrate 30.

The donor substrate 10 provided in stage a) can comprise one of the materials chosen from: silicon, germanium or silicon/germanium alloy.

The support substrate 30 provided in stage a) can be composed of all the materials normally used in the microelectronics, optical, optoelectronics and photovoltaics industries.

In particular, the support substrate 30 comprises at least one of the materials selected from the following group: silicon, silicon carbide, silicon/germanium, glass, ceramic and a metal alloy.

According to an advantageous embodiment, as illustrated in FIG. 3, a dielectric layer 53 can be formed on the first surface 20 of the donor substrate 10 between stage a) and stage b).

The dielectric layer 53 can comprise at least one of the following materials: silicon oxide or silicon nitride.

For example, the dielectric layer 53 can be formed by thermal oxidation of a donor substrate 10, the donor substrate 10 comprising silicon. The thermal oxidation can be carried out at a temperature of between 800° C. and 1100° C., under an oxidizing atmosphere. For example, the thermal oxidation of a donor substrate 10 comprising silicon, at a temperature of 800° C., under an oxygen atmosphere, makes it possible to form a layer of silicon oxide. Low-pressure chemical vapor deposition and plasma-enhanced chemical vapor deposition techniques are also techniques of choice for forming the dielectric layer 53 comprising silicon oxide or silicon nitride.

Stage b) of the process of the manufacture of the composite structure comprises the formation of a zone of weakening 40 in the donor substrate 10. The zone of weakening 40 delimits, with the first surface 20 of the donor substrate 10, a working layer 50. The working layer 50 is intended to be transferred onto the support substrate 30. According to a particularly advantageous embodiment, the zone of weakening 40 is formed by implantation of at least one of the species chosen from: hydrogen ions or helium ions. The formation of the zone of weakening 40 will subsequently be described in detail during the description of the different embodiments.

Stage b) is then followed by a stage c) comprising the assembling of the support substrate 30 and the donor substrate 10. The assembling can, for example, be carried out by molecular bonding. According to a first embodiment illustrated in FIG. 2, the assembling stage can be carried out by bringing the first surface 20 of the donor substrate into contact with the support substrate 30. Alternatively, as illustrated in FIG. 3, when the dielectric layer 53 is formed on the first surface 20 of the donor substrate 10, the assembling stage can be carried out by bringing the dielectric layer 53 and the support substrate 30 into contact.

Stage c) is followed by a stage d) of fracturing the donor substrate 30 along the zone of weakening. On conclusion of the fracturing stage, the working layer 50 is transferred onto the support substrate 30. Advantageously, the dielectric layer 53 was formed on the first surface 20 of the donor substrate 10 and, on conclusion of the fracturing stage d), the working layer 50 and the dielectric layer 53 are transferred onto the support substrate 30. The fracturing stage d) can be carried out by a heat treatment at a temperature of between 300° C. and 500° C. for a period of time between 30 minutes and 24 hours.

Stage d) is followed by a stage e) of thinning the working layer 50. The thinning of the working layer 50 results in a thinned working layer 51. The thinning consumes a nonuniform thickness of the working layer 50.

The thinning of the working layer 50 is advantageously carried out by a stage of sacrificial oxidation. It is a surface treatment that is targeted at creating a layer of oxide 52 on the surface and in the upper part of the working layer 50. The oxidation of a working layer comprising silicon is thus generally carried out between 800° C. and 1000° C.

This process can use, in particular, water vapor (the term "wet oxidation" is then used) or also molecular oxygen (the term "dry oxidation" is then used). The corresponding reactions are:

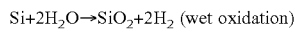Si+2H$_2$O→SiO$_2$+2H$_2$ (wet oxidation)

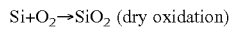Si+O$_2$→SiO$_2$ (dry oxidation)

The wet oxidation is faster but makes it possible to obtain an oxide of a lower quality than that obtained by the dry oxidation.

The oxidizing gas can also contain a few percent of hydrochloric acid (HCl) in order to eliminate the metal ions that may occur therein.

The layer of oxide 52 is formed both by consumption of the working layer 50 and by oxygen contributed by the ambient gas.

According to the thickness desired for the layer of oxide 52 and the oxidation temperature, the oxidation time is generally between a few minutes and a few hours.

The overall thickness of the layer of oxide 52 formed is generally between 50 nm and 500 nm, typically between 100 nm and 400 nm.

The thermal oxidation of the silicon is often carried out using furnaces comprising one or more tubes into which the composite structures to be treated are loaded. For composite structures of large-diameter silicon-on-insulator type, the oxidation is more uniform if it is carried out in furnaces having vertical tubes, in which the composite structures are placed horizontally, one below the other.

However, it is found that the thickness of the layer of oxide 52 is not uniform over the whole of its extent.

Thus, by way of example, in the case of a working layer 50 comprising silicon, a layer of oxide 52, the thickness of which in its central part is of the order of 1500 Å, will have a thickness in its peripheral annular part of the order of 1485 Å and such a layer, the thickness of which in its central part is of the order of 500 Å, will have a thickness in its peripheral annular part of the order of 485 Å.

Such variations in thickness can be observed, for example, using an ellipsometer.

The withdrawal of the layer of oxide 52 or "sacrificial deoxidation" is an etching generally carried out by the wet route.

In the case of the withdrawal of a layer of silicon oxide, the agent providing the chemical etching is based on hydrofluoric acid (HF). After the withdrawal of the layer of silicon oxide 52, a thinned working layer 51 made of silicon is obtained.

It should be noted that, under certain conditions, it is also possible to obtain the reverse, that is to say a layer of oxide 52 that is thicker at its periphery than at its center (that is to say, concave). However, this case is much less frequent than the preceding case.

The parameters capable of resulting in a thicker oxidation at the center, or conversely at the edge, include, for example, the partial pressure and the flow rate of the different gases injected during the oxidation, the optional temperature slope during the oxidation (the cause of an optional temperature gradient between the edge and the center of the wafers) or the position in the furnace.

A description will now be given of the different embodiments of stage b) of formation of the zone of weakening 40. Stage b) is carried out so that the working layer 50 transferred onto the support substrate 30 exhibits a thickness profile on conclusion of stage d), the thickness profile being appropriate for compensating, at least in part, for the nonuniformity in consumption of the working layer 50 during stage e), the thinned working layer 51 being substantially uniform in thickness on conclusion of all of the stages.

In particular, the thickness profile of the working layer 50, on conclusion of the fracturing stage d), is appropriate for compensating for the nonuniformity of a stage of sacrificial oxidation carried out in stage e).

The term "compensating for the nonuniformity" is understood to mean generating a thickness profile of the working layer 50 so that, on conclusion of the thinning stage, the thinned working layer 51 exhibits an essentially constant thickness over its extent.

First Embodiment of Stage b)

According to a first embodiment, the formation of the zone of weakening 40 is carried out by implantation of at least one of the species chosen from: hydrogen ions or helium ions. The total dose of the implanted species is nonuniform over the extent of the zone of weakening 40 and the nonuniformity of the dose of the implanted species is appropriate for generating the nonuniform thickness profile of the working layer 50 on conclusion of the fracturing stage d).

The term "dose of implanted species" is understood to mean the amount of implanted species per unit of surface area of the zone of weakening 40. The dose of implanted species is measured in atoms per cm$^2$.

The implantation stage is advantageously carried out by a single wafer implant device. In contrast to batch wafer implant devices, a single wafer implant device makes it possible to implant a nonuniform dose of species over the whole of the extent of the zone of weakening 40.

It has been found that the thickness profile of the working layer 50 on conclusion of the fracturing stage depends on the uniformity in the dose of implanted species over the whole of the extent of the zone of weakening 40.

An excess thickness of a part of the working layer 50 after stage d) is observed when the part is included, on conclusion of stage b), in a region of the zone of weakening 40 exhibiting a dose of implanted species in excess with respect to the remainder of the zone of weakening 40. Consequently, an excess dose of implanted species in a region of the zone of weakening 40 makes it possible to generate an excess thickness of the working layer 50 on conclusion of stage d) at the region of the zone of weakening 40.

Figure 4A:
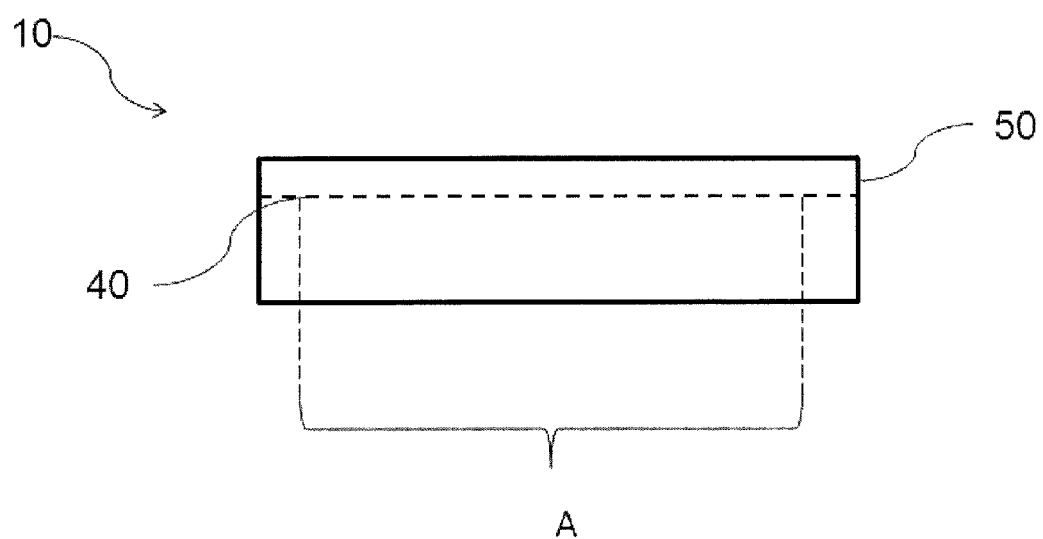
FIGS. 4A and 4B are diagrammatic representations of an implantation stage and of a fracturing stage according to the disclosure.
Figure 4B:
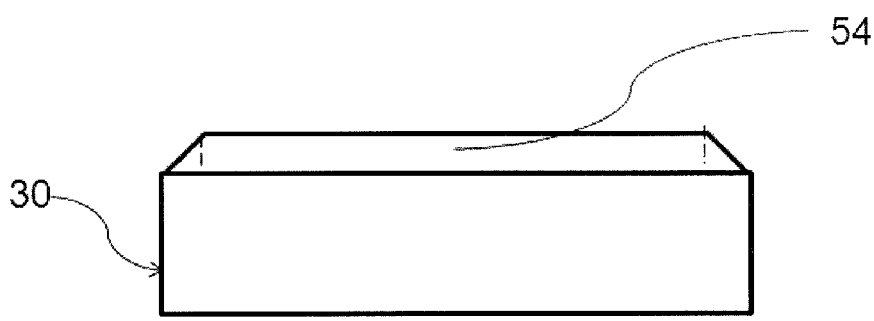

Thus, as represented in FIGS. 4A and 4B, a region A of the zone of weakening 40 exhibits an excess dose of implanted species with respect to the remainder of the zone of weakening 40. The portion 54 of the working layer 50 included in the region A in stage b) will exhibit, on conclusion of stage d), a greater thickness than the remainder of the working layer 50.

Figure 5:
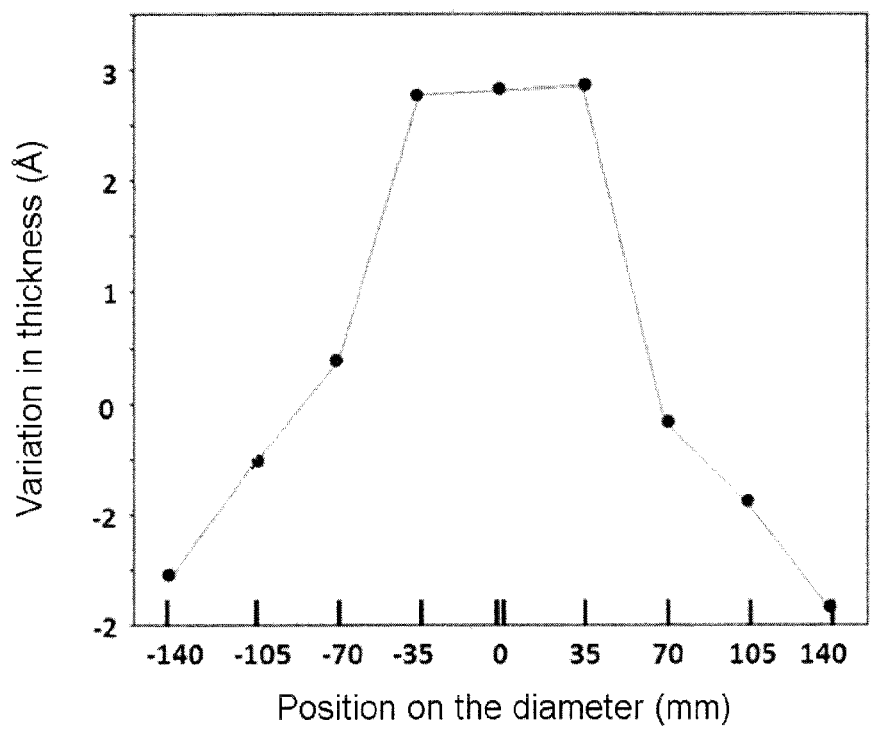
FIG. 5 represents a thickness profile of a working layer along a diameter, which layer is obtained after the fracturing stage according to the disclosure.

By way of example, FIG. 5 illustrates the thickness profile of a silicon layer transferred onto a support substrate. In this specific case, the implantation conditions are as follows:

Implantation of hydrogen ions at an energy of approximately 20 keV and a dose of approximately $1 \times 10^{16}$ atoms/cm$^2$, which is constant over the whole of the extent of the zone of weakening.

Implantation of helium ions at an energy of approximately 30 keV with an overdose of 3% over the central part over a diameter of the order of 100 mm.

It is then found that, after the fracturing stage d), the working layer 50 made of silicon exhibits a greater thickness at the center than in its annular peripheral zone. The thickness profile of the working layer is then described as rounded profile.

For example, when the layer of oxide 52 formed during the thinning stage e) exhibits a rounded thickness profile, it is advantageous to implant a greater dose of species in the central part of the zone of weakening (40) and a lower dose of species on proceeding toward the annular periphery of the zone of weakening (40). The dose of implanted species in the central part of the zone of weakening 40 can be greater by between 2% and 9%, preferably between 3% and 6%, than the dose of implanted species in the annular periphery of the zone of weakening. Thus, the thinned working layer 51 will exhibit an improved uniformity in thickness with respect to the state of the art. The term "improved uniformity in thickness" is understood to mean lower variations in thickness.

Conversely, when the layer of oxide 52 formed during the thinning stage e) exhibits a bowl-shaped thickness profile, it is advantageous to implant a greater dose of species in the annular periphery of the zone of weakening 40 and a lower dose of species in the central part of the zone of weakening 40. The dose of implanted species in the annular periphery of the zone of weakening 40 can be greater by between 2% and 9%, preferably between 3% and 6%, than the dose of implanted species in the central part of the zone of weakening 40. Thus, the thinned working layer 51 will exhibit an improved uniformity in thickness with respect to the state of the art. The term "improved uniformity in thickness" is understood to mean lower variations in thickness.

Particularly advantageously, the dose of hydrogen ions implanted in the zone of weakening 40 is constant over the whole of the extent of the zone of weakening 40 and the dose of implanted helium ions is nonuniform over the extent of the zone of weakening 40. Thus, the thickness profile of the working layer is conditioned by the nonuniformity in the dose of the implanted helium ions.

Second Embodiment of Stage b)

According to a second embodiment, stage b) is carried out in two stages:

First implantation of species: according to a first implantation energy, the dose of the first implantation of species being nonuniform over the extent of the zone of weakening 40.

Second implantation of species: according to a second implantation energy lower than the first implantation energy, the dose of the second implantation of species being nonuniform over the extent of the zone of weakening 40.

The second implantation energy is greater than 90% of the first implantation energy. The dose of the first implantation of species and the dose of the second implantation of species are complementary over the whole of the extent of the zone of weakening 40. The nonuniformity in the dose of the first implantation of species and the nonuniformity in the dose of the second implantation of species are appropriate for generating the thickness profile of the working layer 50 on conclusion of the fracturing stage d).

The dose of implanted species is measured in atoms per cm$^2$.

The implantation stage is advantageously carried out by a single wafer implant device. In contrast to batch wafer implant devices, a single wafer implant device makes it possible to implant a nonuniform dose of species over the whole of the extent of the zone of weakening 40.

Figure 6:
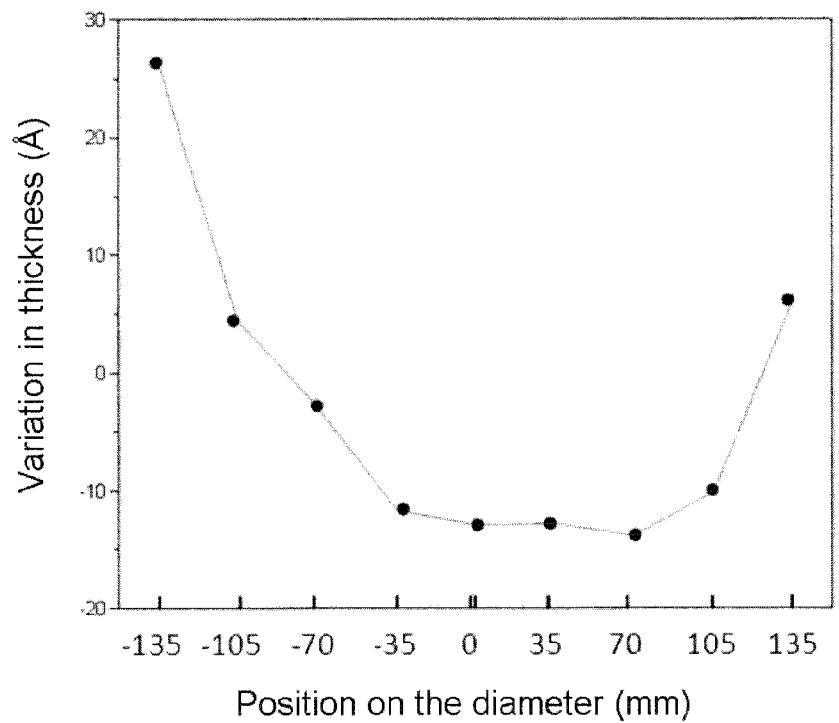
FIG. 6 represents a thickness profile of a working layer along a diameter, which layer is obtained after the fracturing stage according to the disclosure.

By way of example, the first implantation is an implantation of hydrogen ions at an implantation energy equal to 24.07 keV. The dose of hydrogen ions implanted during the first implantation is equal to approximately $1 \times 10^{16}$ atoms/cm$^2$ over a central part of the zone of weakening 40 with a diameter of 200 mm and approximately $0.5 \times 10^{16}$ to $0.6 \times 10^{16}$ atoms/cm$^2$ over the remainder of the zone of weakening 40. The second implantation is an implantation of hydrogen ions at an implantation energy equal to 23.08 keV. The dose of hydrogen ions during the second implantation is equal to $0.5 \times 10^{16}$ to $0.6 \times 10^{16}$ atoms/cm$^2$ over a central part of the zone of weakening 40 with a diameter of 200 mm and approximately $1 \times 10^{16}$ atoms/cm$^2$ over the remainder of the zone of weakening 40. It is then found that, after the fracturing stage d), as represented in FIG. 6, the working layer 50 made of silicon exhibits a lower thickness at the center than in its annular peripheral zone. The thickness profile of the working layer is then described as a bowl-shaped profile.

Particularly advantageously, the nonuniformity of the thinning stage e) can be determined prior to the implementation of the process according to the disclosure. For a thinning stage e) carried out by sacrificial oxidation, this can consist in thermally oxidizing a donor substrate 10 or a working layer 50 and in measuring the thickness profile thus formed with a device for measuring the thickness of layers, for example, an ellipsometer. The knowledge of the thickness profile of the layer of oxide formed during the thinning stage then makes it possible to adjust the stage of formation of the zone of weakening for the production of composite structures by volume.

More particularly, thermal oxidation furnaces these days exhibit a relatively good thermal stability. Consequently, a stage of thermal oxidation reproduced on several occasions will produce layers of oxide always exhibiting substantially the same thickness profile. The process according to this disclosure will then advantageously be employed for the production of composite structures of silicon-on-insulator type.

Furthermore, the process according to the disclosure makes it possible to manufacture composite structures and, more particularly, silicon-on-insulator structures for which the thinned working layer 51 exhibits reduced variations in thickness with respect to the state of the art.

The invention claimed is:

1. A process for the manufacture of a composite structure comprising the following stages:
    a) providing a donor substrate and a support substrate, the donor substrate comprising a first surface;
    b) forming a zone of weakening in the donor substrate, the zone of weakening delimiting, with the first surface of the donor substrate, a working layer;
    c) assembling the support substrate and the donor substrate;
    d) fracturing the donor substrate along the zone of weakening, so as to transfer the working layer onto the support substrate; and
    e) thinning the working layer so as to form a thinned working layer, the thinning consuming a nonuniform thickness of the working layer;
    wherein stage b) comprises an implantation step of a nonuniform dose over the extent of the zone of weakening such that the working layer transferred onto the support substrate exhibits a thickness profile on conclusion of stage d), the thickness profile being appropriate for compensating, at least in part, for the nonuniformity in consumption of the working layer during stage e), the thinned working layer being substantially uniform in thickness on conclusion of all of the stages.

2. The manufacturing process according to claim 1, wherein the thinning stage e) comprises a stage of oxidation of the working layer so as to form a layer of oxide, the thickness of the layer of oxide being nonuniform, followed by a stage of withdrawal of the layer of oxide.

3. The manufacturing process according to claim 2, wherein stage b) is carried out by implantation of at least one of the two species H or He.

4. The manufacturing process according to claim 3, wherein the total dose of the implanted species is nonuniform over the extent of the zone of weakening, the nonuniformity of the dose of the implanted species being appropriate for generating the thickness profile of the working layer on conclusion of the fracturing stage d).

5. The manufacturing process according to claim 4, wherein the implantation of at least one of the two species H or He includes implantation of a dose of hydrogen ions and implantation of a dose of helium ions, the dose of implanted hydrogen ions being uniform over the whole of the extent of the zone of weakening and the dose of implanted helium ions being nonuniform over the extent of the zone of weakening.

6. The manufacturing process according to claim 4, wherein the layer of oxide formed during stage e) exhibits a greater thickness in its central part and a lower thickness on proceeding toward the annular periphery of the layer of oxide, and the dose of implanted species is greater in the central part of the zone of weakening and lower on proceeding toward the annular periphery of the zone of weakening.

7. The manufacturing process according to claim 4, wherein the layer of oxide formed during stage e) exhibits a lower thickness in its central part and a greater thickness on proceeding toward the annular periphery of the layer of oxide, and the dose of species implanted during stage b) is lower in the central part of the zone of weakening and greater on proceeding toward the annular periphery of the zone of weakening.

8. The manufacturing process according to claim 3, wherein stage b) is carried out in two stages:
    first implantation of species, according to a first implantation energy, the dose of the first implantation of species being nonuniform over the extent of the zone of weakening,
    second implantation of species, according to a second implantation energy lower than the first implantation energy, the dose of the second implantation of species being nonuniform over the extent of the zone of weakening,
    the second implantation energy being greater than 90% of the first implantation energy, the dose of the first implantation of species and the dose of the second implantation of species being complementary over the whole of the extent of the zone of weakening and the nonuniformity of the dose of the first implantation of species and the nonuniformity of the dose of the second implantation of species being appropriate for generating the thickness profile of the working layer on conclusion of the fracturing stage d).

9. The manufacturing process according to claim 8, wherein the species implanted during the first implantation and the second implantation comprise hydrogen ions.

10. The manufacturing process according to claim 9, wherein a dielectric layer is formed on the first surface of the donor substrate before stage b).

11. The manufacturing process according to claim 10, wherein the dielectric layer comprises at least one of the following materials: silicon oxide or silicon nitride.

12. The manufacturing process according to claim 11, wherein the donor substrate comprises at least one of the following materials: silicon, germanium or silicon/germanium alloy.

13. The manufacturing process according to claim 5, wherein the layer of oxide formed during stage e) exhibits a greater thickness in its central part and a lower thickness on proceeding toward the annular periphery of the layer of oxide, and the dose of implanted species is greater in the central part of the zone of weakening and lower on proceeding toward the annular periphery of the zone of weakening.

14. The manufacturing process according to claim 5, wherein the layer of oxide formed during stage e) exhibits a lower thickness in its central part and a greater thickness on proceeding toward the annular periphery of the layer of oxide, and the dose of species implanted during stage b) is lower in the central part of the zone of weakening and greater on proceeding toward the annular periphery of the zone of weakening.

15. The manufacturing process according to claim 1, wherein a dielectric layer is formed on the first surface of the donor substrate before stage b).

16. The manufacturing process according to claim 15, wherein the dielectric layer comprises at least one of the following materials: silicon oxide or silicon nitride.

17. The manufacturing process according to claim 1, wherein the donor substrate comprises at least one of the following materials: silicon, germanium or silicon/germanium alloy.

* * * * *